(12) United States Patent
Nakamura et al.

(10) Patent No.: US 6,548,811 B1
(45) Date of Patent: Apr. 15, 2003

(54) TRANSMISSION ELECTRON MICROSCOPE APPARATUS WITH EQUIPMENT FOR INSPECTING DEFECTS IN SPECIMEN AND METHOD OF INSPECTING DEFECTS IN SPECIMEN USING TRANSMISSION ELECTRON MICROSCOPE

(75) Inventors: Kuniyasu Nakamura, Musashino (JP); Hiroshi Kakibayashi, Nagareyama (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/504,044

(22) Filed: Feb. 14, 2000

(30) Foreign Application Priority Data

Feb. 22, 1999 (JP) .......................... 11-043235

(51) Int. Cl.⁷ ..................... H01J 37/04; H01J 37/295
(52) U.S. Cl. ................... 250/311; 250/306; 250/307
(58) Field of Search ............... 250/306, 307, 250/308, 311, 363.02, 363.04, 396 R

(56) References Cited

U.S. PATENT DOCUMENTS

| 5,142,148 A | * | 8/1992 | Sato .......................... 250/307 |
| 5,436,449 A | * | 7/1995 | Takahashi et al. .......... 250/307 |
| 5,552,602 A | * | 9/1996 | Kakibayashi et al. ....... 250/311 |
| 5,866,905 A | * | 2/1999 | Kakibayashi et al. ....... 250/311 |
| 6,051,834 A | * | 4/2000 | Kakibayashi et al. ....... 250/311 |

* cited by examiner

Primary Examiner—John R. Lee
Assistant Examiner—Anthony Quash
(74) Attorney, Agent, or Firm—Antonelli, Terry, Stout & Kraus, LLP

(57) ABSTRACT

In order to detect automatically at a high speed and a high probability rate the crystal defects and shape abnormalities in a specimen over a wide area of said specimen, a transmission electron microscope apparatus is employed which has an electron source, a first electrostatic lens, a second electrostatic lens, a third electrostatic lens, a first condenser lens, a second condenser lens, a pre-field objective lens, a deflection coil, a first projection lens, a second projection lens, a third projection lens, a first image shift coil, a second image shift coil, and an image acquisition apparatus, etc. The detection of crystal defects is made definite by observing the specimen image at the same location by multiple variations of the electron beam incidence direction using the deflection coil. In addition, the crystal defects are detected at a high speed by linking the deflection ratios of the deflection coil and of the first image shift coil and the second image shift coil, and carrying out compensation so that image shifts on the image acquisition apparatus due to the multiple electron beam incidence directions are mutually cancelled.

7 Claims, 13 Drawing Sheets

SHIFT OF IMAGE

CORRECTION OF
SHIFT OF IMAGE

CORRECTION OF
SHIFT OF IMAGE

TRANSMISSION ELECTRON MICROSCOPE APPARATUS WITH EQUIPMENT FOR INSPECTING DEFECTS IN SPECIMEN AND METHOD OF INSPECTING DEFECTS IN SPECIMEN USING TRANSMISSION ELECTRON MICROSCOPE

BACKGROUND OF THE INVENTION

The present invention is related to transmission electron microscopes and methods of inspection using them, and in particular, to methods of inspection of semiconductor substrates.

A method of detecting crystal defects in specimen using conventional transmission electron microscopes has been disclosed, for example, in Transmission Electron Microscopy, Plenum Publishing Corporation (1996), p.379~p.445. In this method, the sample is tilted so that the electron beam satisfies the diffraction conditions for the crystal defect of the specimen, and a specific diffraction electron beam is made to pass through using objective lens aperture while all other electron beams are cut off, thereby detecting the crystal defect by increasing the contrast of the crystal defect.

In the above method of detecting crystal defects in specimen using conventional transmission electron microscopes, the transmission electron microscope image is observed while setting the specimen inclination in various directions, and the presence or absence of crystal defects is judged from the contrast of the image.

However, in the range in which the specimen stage can be adjusted mechanically, it is difficult to make the shift in the image when the specimen is inclined to smaller than about 1 $\mu$m. As a result, in order to inspect the presence or absence of crystal defects at the same location, it was necessary to move the specimen stage manually so as to observe the same field of view whenever the specimen inclination is changed, and hence a long time was necessary until the crystal defect could be detected. Therefore, inspecting for the rate of occurrence of crystal defects over a wide field of view was almost impossible because of the extremely long time required for such an inspection. On the other hand, although it is possible to inspect for the rate of occurrence of crystal defects over a wide field of view by limiting the direction of electron beam incidence to only one direction, since the detection of crystal defects is strongly dependent upon the direction of incidence of the electron beam, as has been described above, it is possible that the crystal defects are not detected even if they are present, and hence it is not possible to inspect for the accurate rate of occurrence of crystal defects. In addition, after inspecting for the rate of occurrence of crystal defects over a wide field of view, if it is necessary to observe in detail a specific defect location part, it is necessary to move the specimen stage thereby bringing the position of that defect to within the field of view for analysis.

However, all stage movements are done manually, and since the operator has to calculate the address positions of the defect locations, it becomes necessary to start moving the stage from the origin of counting the position each time while counting the address, it takes a considerably long time to move to the location where each defect was detected, and also, there is the problem that the stage cannot be moved to the correct location of the defect because of manual errors in counting the address.

For example, consider that there are 256×256 memory cells in one memory mat, these are subjected to the presence or absence of defects with the direction of electron beam irradiation being limited to one direction. It takes 30 seconds to inspect the memory cells in units of 16 cells and to verify the presence or absence of defects in each image, which is the total time including time required to move the stage manually, to adjust the focus, and to judge the presence or absence of defects by manual observation. Under these conditions, in order to complete the inspection, it takes a very long time of 1.4 days (=(256×256)/(16×0.5)=2048 minutes). Because of this, this inspection method is not practical since even the defect detection rate is low and a very long time is required for inspection.

A method of inspection using a conventional electron microscope apparatus has been disclosed, for example, in Japanese Unexamined Patent Publication No. Hei 10-74813. In this method, the sample is irradiated with an electron beam, and the image is obtained from the intensity of the secondary electrons generated from the surface of the specimen, and the judgment of defects is made from the contrast of the image. Further, as has been disclosed in Japanese Unexamined Patent Publication No. Hei 5-215694, as a method other than electron microscopes, the specimen is irradiated with X-rays, a transmission image of the specimen pattern is obtained and the judgment of defects is made from that pattern.

In the above inspection methods using an electron microscope apparatus, since the sample is irradiated with an electron beam and the image is obtained from the intensity of the secondary electrons generated from the surface of the specimen, although it is possible to judge the shape defects on the surface of the specimen, it is not at all possible to evaluate the crystal defects in the specimen. In addition, when the pattern of the specimen is observed by irradiating the specimen with X-rays, only the shape of the specimen can be observed, and the crystal defects in the specimen cannot be evaluated.

SUMMARY OF THE INVENTION

In the conventional method of inspecting crystal defects in the specimen using a transmission electron microscope apparatus, since the crystal surface satisfying the black conditions appears as a contrast in the transmission electron microscope image, it is not possible to judge that there are no defects by merely observing from one direction. Therefore, it is necessary to set the specimen inclination at various angles and to judge the presence or absence of crystal defects from the image contrast, it takes a very long time to judge the presence or absence of crystal defects in one section to be inspected, and an extremely long time is required to inspect for the crystal defect occurrence rate in a wide field of view. In addition, in a wide field of view, the defect detection rate decreases if the inspection for determining the crystal defect occurrence rate is done by limiting the direction of electron beam incidence to only one direction. In addition, after inspecting, during observation and analysis in detail of a specific defect location part, it is necessary for the operator to move manually the specimen stage to the address location of the part with the defect, and hence a long time is required to move the stage to the defect detection part, and also there is the possibility of not being able to move to the defect detection part because of human errors in counting the address. Further, in the method in which the image is obtained from the secondary electrons emitted from the specimen surface and the Good or No Good judgment is made from the contrast of that image, although it is possible to judge the shape defects on the surface of the specimen, it is not at all possible to evaluate the crystal defects in the specimen. In addition, even in the method of observing the pattern of the specimen when it is irradiated with X-rays, it is only possible to observe the shape of the specimen. The purpose of the present invention is to provide a transmission electron microscope apparatus and a method of inspection using such an apparatus, in which it is possible to detect automatically the crystal defects and shape abnormalities in the specimen over a wide area of the specimen at both a high speed and a high probability rate, and also possible, during detailed analysis after inspection, to set automatically the parts where crystal defects or shape abnormalities were detected to the analysis position.

In particular, the present invention is intended to provide a method and apparatus for identifying crystal defects in the base material caused by preparation using a base material having a crystalline structure.

For example, if we consider that there are 256×256 memory cells in one memory mat, and it takes 0.5 seconds to judge the presence or absence of defects by inspecting the memory cells in units of 16 cells, it takes 34 minutes to complete the inspection (that is, (256×256)/(16×0.5)=2048 seconds=34 minutes), and hence this becomes a very practical inspection method.

In order to achieve the above objectives, the configuration of irradiating the specimen with an electron beam automatically from several directions is described below.

In the present invention, in a transmission electron microscope provided with an electrostatic lens with one or more stages for making the electron beam generated from the cathode a beam with high energy, a condenser lens and objective lens with one or more stages for irradiating the electron beam on the specimen in a direction parallel to the optical axis of the transmission electron microscope, a specimen holder for supporting the specimen located at the objective lens or below it, one or more stages of imaging lens for enlarging the acquired image, an image acquisition apparatus for detecting and recording the acquired image, and one or more stages of a deflection coil for varying the angle of incidence of the electron beam on the specimen, it has been made possible to obtain the detection rate of crystal defects at a high efficiency by putting emphasis on the contrast in the transmitted beam and from the contrast difference at the same location on the specimen at a plural number of incident angles using said deflection coil to vary the electron beam incidence angle over a number of different values.

Furthermore, a computer program or an electronic circuit is provided for driving in a linked manner the one or more stages of the image shift coils that move in two dimensions the imaging plane of the objective lens, said deflection coil, and said image shift coil, and it has been made possible to detect the crystal defects at high speeds by compensating the image shift due to electron beam irradiation at various angles of incidence in said image acquisition apparatus because of driving in a linked manner said deflection coil and said image shift coil.

In addition, it has been made possible to automatically detect at high speeds the crystal defects and shape abnormalities over a wide area of the specimen by making the movement of the specimen stage automatic, and also, the configuration has been made so that the addresses of the parts with crystal defects or shape abnormalities are recorded, and by reading them out at the time of detailed analysis after inspection, it becomes possible to set automatically the part with crystal defects or shape abnormalities at the analysis point.

In this manner, the present invention provides concrete apparatuses and methods that permit detection at speeds that are about 70 times faster than the conventional methods.

In other words, the present invention is one that was invented with the task of testing one sample (a DRAM of about 130,000 bits) in a time duration of about 30 minutes.

In a transmission electron microscope in which the electron beam generated from an electron source is accelerated to a specific voltage by an electrostatic lens, the accelerated electron beam is irradiated parallel to the optical axis on the specimen by a condenser lens and an objective lens, the angle of incidence of the electron beam on the specimen is varied by a deflection coil, the transmitted image of the specimen is magnified by a projection lens, and the intensity of the image is detected by an image acquisition apparatus, the present invention provides a transmission electron microscope apparatus with a configuration containing a controlling means by which the electron beam is irradiated from different incident angles on the same address-specified location of the specimen using said deflection coil, and a means for displaying on the display screen multiple transmission images obtained by impinging the electron beam at different angles of incidence.

In addition, in a transmission electron microscope in which the electron beam generated by an electron source is accelerated up to a specific voltage by an electrostatic lens, the accelerated electron beam is irradiated on the specimen in a direction parallel to the optical axis of the electron beam microscope by a condenser lens and an objective lens, the angle of incidence of the electron beam on the specimen is varied by a deflection coil, the transmission image of the specimen is enlarged by a projection lens, and the image intensity is detected by an image acquisition apparatus, the present invention provides a transmission electron microscope apparatus with a configuration containing a controlling means so that the electron beam is irradiated from different incident angles on the same location of the specimen using said deflection coil, a means for comparing the images obtained by impinging the electron beam at different angles of incidence with a reference image that is either a transmission image obtained by irradiating said electron beam on the specimen or an image formed based on the design values and recorded beforehand as the reference image, and a means for recording the presence of specimen defect according to the result of such comparison.

In addition, in a transmission electron microscope in which the electron beam generated from an electron source is accelerated to a specific voltage by an electrostatic lens, the accelerated electron beam is irradiated parallel to the optical axis on the specimen by a condenser lens and an objective lens, the angle of incidence of the electron beam on the specimen is varied by a deflection coil, the transmitted image of the specimen is magnified by a projection lens, and the intensity of the image is detected by an image acquisition apparatus, the present invention provides a transmission electron microscope apparatus with a configuration containing a means by which the electron beam is irradiated from different incident angles on the same location of the specimen using said deflection coil, the acquired multiple transmission images are compared with a reference image, and the presence of defects in the specimen based on the result of such comparison is recorded, a means for deflecting the electron beam using an image shift coil that compensates the shift in said transmission image due to changes in the angles of incidence of the electron beam, and a means for driving the deflection coil and the image shift coil so that the deflection of the electron beam by said deflection coil and the deflection of the electron beam by said image shift coil are linked with each other.

Further, the present invention provides a transmission electron microscope apparatus in which said reference image can be recorded beforehand as a basic image for said comparison.

The present invention provides a transmission electron microscope apparatus in which said reference image is a part of the images among the multiple transmission images obtained by impinging the electron beam from different angles of incidence.

The present invention provides a transmission electron microscope apparatus containing a means for recording the image at a specific position and its position address as determined by the judgment of the presence or absence of defects, and a means for displaying the image recorded in the specimen stage using that position address.

The present invention provides a transmission electron microscope apparatus containing a means for recording the image at a specific position and its observation conditions as determined by the judgment of the presence or absence of defects, and a means for displaying the image recorded in the specimen stage using those observation conditions.

In a method of inspection using a transmission electron microscope in which the electron beam generated by a cathode is accelerated up to a specific voltage by an electrostatic lens, the accelerated electron beam is irradiated on the specimen in a direction parallel to the optical axis of the electron beam microscope by a condenser lens and an objective lens, the angle of incidence of the electron beam on the specimen is varied by a deflection coil, the transmission image of the specimen is enlarged by a projection lens, and the image intensity is detected by an image acquisition apparatus, the present invention provides a method of inspection using a transmission electron microscope apparatus with a configuration including the method of irradiating the electron beam from different incident angles on the same location of the specimen using said deflection coil, comparing with a reference image the images obtained by impinging the electron beam at different angles of incidence, and recording the presence of specimen defect according to the result of such comparison.

In a method of inspection using a transmission electron microscope in which the electron beam generated by a cathode is accelerated up to a specific voltage by an electrostatic lens, the accelerated electron beam is irradiated on the specimen in a direction parallel to the optical axis of the electron beam microscope by a condenser lens and an objective lens, the angle of incidence of the electron beam on the specimen is varied by a deflection coil, the transmission image of the specimen is enlarged by a projection lens, and the image intensity is detected by an image acquisition apparatus, the present invention provides a method of inspection using a transmission electron microscope apparatus with a configuration including the method of irradiating the electron beam from different incident angles on the same location of the specimen, and the presence or absence of defects in the image is judged during the blanking period after each image of the multiple numbers of transmission images.

In addition, the present invention provides a method of inspection using a transmission electron microscope apparatus in which the angle of incidence of the electron beam is varied during the blanking period after acquiring each image.

In addition, the present invention provides a method of inspection using a transmission electron microscope apparatus in which the image is displayed after moving the specimen stage during the blanking period after acquiring each image.

DETAILED DESCRIPTION OF THE PREFERRED EMBODIMENT

The preferred embodiments of the present invention are described in the following based on the drawings.

Figure 1:
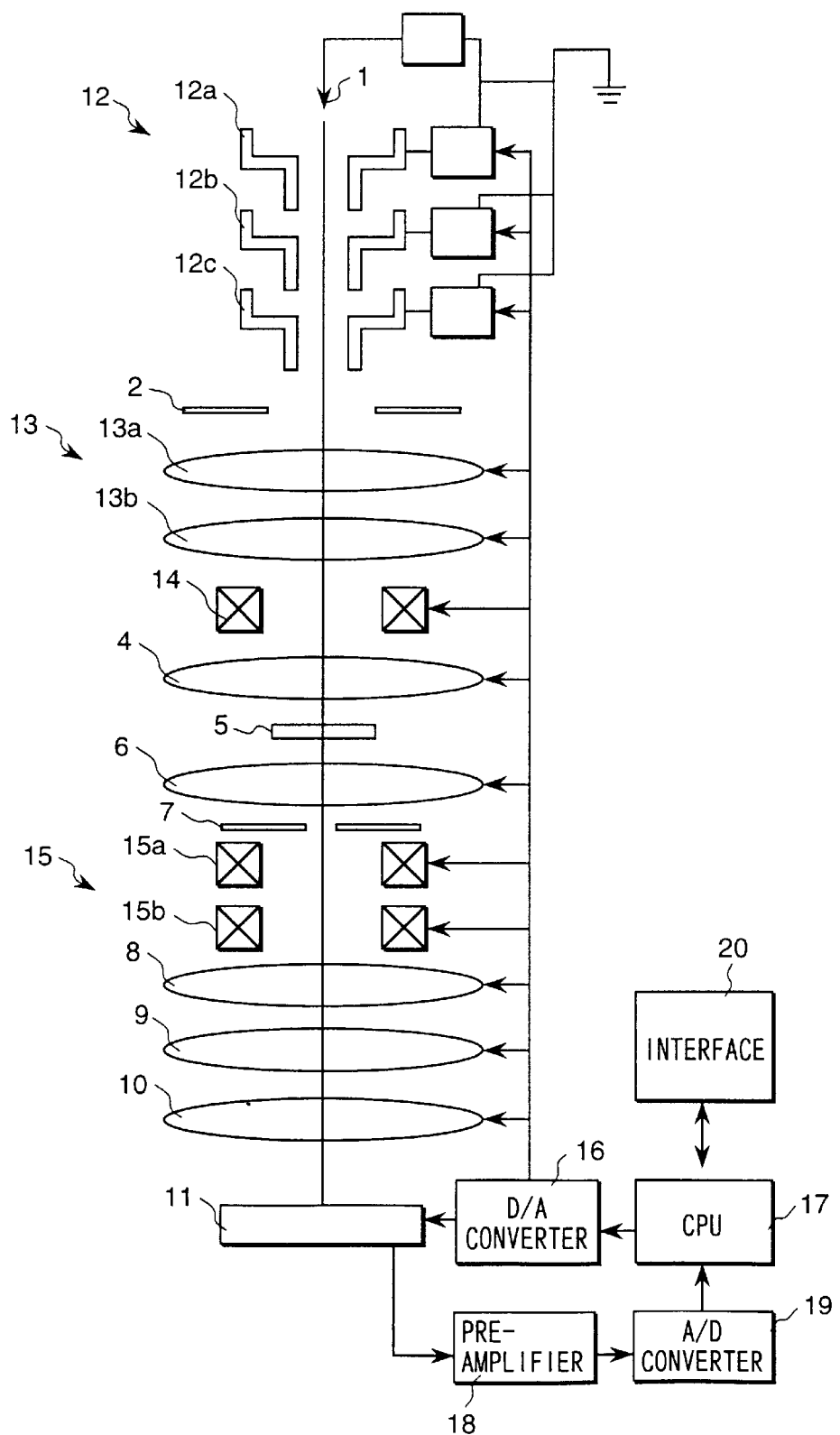
FIG. 1 is a configuration diagram showing the overall schematic of a preferred embodiment of the present invention.

FIG. 1 shows the overall configuration of the first preferred embodiment of the present invention. In this figure, the electron beam generated by the electron source 1 is passed through the electrostatic lens 12 and the condenser aperture 2. The electrostatic lens 12 is constituted by a multi-stage electrostatic lens from 12a to 12c, and accelerates the electron beam up to a specific acceleration voltage. By setting the acceleration voltage per stage to about 30 kV and varying the voltages applied to the lenses of the different stages, it is possible to vary the final electron beam acceleration voltage. The electron beam accelerated up to the specific acceleration voltage is made to enter the condenser lens 13. The electron beam is made to impinge on the specimen 5 in a parallel manner by making the image plane position of the condenser lens 13 coincide with the pre-field focal plane of the pre-field objective lens 4. At this time, the condenser aperture 2 placed at the top stage of the condenser lens 13 has been inserted so as to exclude the electrons with large off-axis distances relative to the optical axis, and the distortion due to spherical aberration of the electron beam impinged on the specimen 5 is reduced.

The condenser lens 13 is composed of the first stage condenser lens 13a and the second stage condenser lens 13b, and the electron beam accelerated by these lenses gets enlarged or reduced. The electron beam passing through the specimen 5 is focused by the post-field objective lens 6 and forms an enlarged image below the post-field objective lens 6. In order to observe the enlarged image, the electron beam is made to impinge on the specimen 5 in a parallel manner by making the image plane position having as its physical plane the electron source 1 formed by the first stage condenser lens 13a and the second stage condenser lens 13b coincide with the pre-field focal plane of the pre-field objective lens 4.

The enlarged image is successively enlarged by the first stage projection lens 8, the second stage projection lens 9, and the third stage projection lens 10. By varying the combination of the current excitations of the first stage projection lens 8, the second stage projection lens 9, and the third stage projection lens 10, it is possible to project on the image acquisition apparatus 11 an image with a magnification of about 1000 to 1 million. The objective aperture 7 placed below the pre-field objective lens 6 is placed at the diffraction figure position formed according to the direction of diffraction of the electron beam by the specimen 5, and has the role of giving contrast by electron diffraction to the enlarged image by allowing to pass through only a specific diffracted electron beam. The image that is successively enlarged by the post-field objective lens 6, the first stage projection lens 8, the second stage projection lens 9, and the third stage projection lens 10 is acquired and recorded by the image acquisition apparatus 11.

On the other hand, it is possible to form the condenser probe on the specimen 5 by setting the image plane positions of the first stage condenser lens 13a and the second stage condenser lens 13b on the under-focus side or the over-focus side of the pre-field objective focal plane of the pre-field objective lens 4 and varying the current excitation of the pre-field objective lens 4. This condenser probe is used when carrying out the analysis over a specific small area the characteristic X-rays, etc., emitted from the specimen 5. The deflection coil 14 has the role of varying the angle of incidence of the electron beam on the specimen 5, and has been set so that it is possible to observe the crystal defects present in the specimen at various angles of incidence of the electron beam.

The image shift coil 15 has been provided for compensating the shift of the image due to deflection of the electron beam by the deflection coil 14. The image shift coil 15 is composed of the first stage image shift coil 15a and the second stage image shift coil 15b, and parallel reversion has been set by this two-stage deflection.

The control of all lenses and coils is done by the central processing unit CPU 17 via the D/A converter 16, and the operator can set the conditions via the interface 20. The image acquired by the image acquisition apparatus 11 is passed through the pre-amplifier 18 and the A/D converter 19 and is entered into the CPU 17 as a digital image. All lens control is carried out by the CPU 17, such as the control of the electron beam acceleration voltage by varying the voltages applied to the multiple stage electrostatic lens indicated as 12a to 12c, control of the irradiation conditions by varying the excitation currents of the first stage condenser lens 13a and the second stage condenser lens 13b, focus control by varying the excitation current of the post-field objective lens 6, and magnification ratio control by varying the excitation currents of the first stage projection lens 8, of the second stage projection lens 9, and of the third stage projection lens 10. Coil controls are being carried out, such as control of the electron beam incidence angle by varying the excitation current of the deflection coil, and control of the amount of image shift by varying the excitation currents of the first stage image shift coil 15a and the second stage image shift coil 15b. In particular, the control of the deflection coil 14 is linked by programming with the control of the first stage image shift coil 15a and the second stage image shift coil 15b, and the first stage image shift coil 15a and the second stage image shift coil 15b are excited so as to cancel out the image shift caused by the deflection of the electron beam by the deflection coil 14. The CPU 17 controls so that the ratio of the deflection amounts due to the deflection coil 14 and the image shift coil is always constant and with opposite phase, and the excitation current values are output after conversion from digital to analog signal format.

Figure 2:
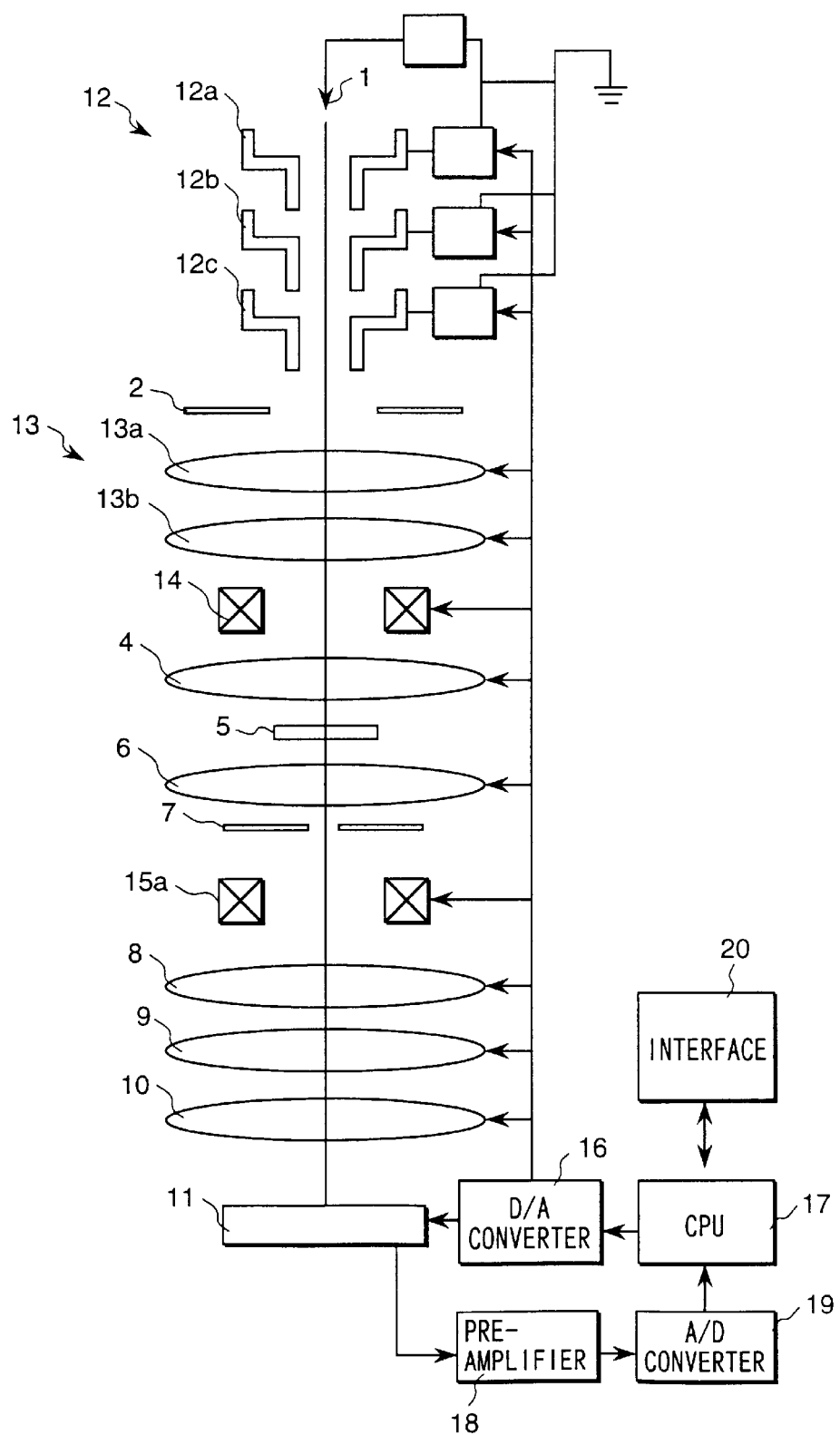
FIG. 2 is a configuration diagram showing the overall schematic of a second preferred embodiment of the present invention.

FIG. 2 shows the second preferred embodiment of the present invention regarding the method of control of the lenses and coils in a transmission electron microscope apparatus. Although the configuration is almost equivalent to that of the first preferred embodiment shown in FIG. 1, the configuration in this case is one in which the deflection is made by a single stage of the image shift coil 25. The role of the image shift coil 25 is identical to that in the first preferred embodiment, and is that of compensating for the shift in the image caused by deflection of the electron beam by the deflection coil 14. Even the methods of control are similar, and the excitation current of the image shift coil 25 is controlled by the CPU 17 in link with the excitation current of the deflection coil 14.

Next, a method of detecting at almost 100% probability the crystal defects present in the specimen is described in the following.

The defects present in the specimen are dislocations and stacking faults caused by disturbances in the atomic arrangement, and these are not necessarily present in any specific crystal orientation. In other words, when observed from a specific direction, although crystal defects can be observed when the diffraction conditions are matched, they cannot be observed when the diffraction conditions are not matched. Therefore, in order to detect crystal defects without fail, it is necessary to observe the same location from a number of different electron beam incidence directions.

In order to implement this, it is possible to conceive of methods in which observation is made with the direction of incidence of the electron beam kept fixed while the inclination of the specimen itself is varied, or methods in which the observation is made with the specimen itself being kept fixed while the angle of incidence of the electron beam is varied. The task in detecting crystal defects at a high speed and inspecting the rate of occurrence of defects over a large area is how to compensate for at a high speed the shift in the image due to tilting the specimen or due to changing the direction of incidence of the electron beam, and how to acquire the image after compensation. Firstly, when the image plane shift when the specimen is tilted is the shift of the mechanical center of the specimen stage. Normally, when the specimen is tilted, the image plane position is compensated for manually using the specimen fine movement mechanism. This can also be compensated for using an image shift coil when the amount of shift is small.

However, although there is repeatability in the amount of shift when the tilting of the specimen is in one direction, with a uniform feedback based only on the information of the tilting angle, it is only possible to carry out control with an accuracy of about 1 μm due to the mechanical accuracies of gears, etc. Therefore, the method of observing with the specimen itself being kept fixed while varying the direction of incidence of the electron beam becomes necessary in order to detect crystal defects at high speeds and inspect the rate of occurrence of defects over a wide area.

The task in this case is how to compensate for the shift of the image caused by varying the direction of incidence of the electron beam.

Figure 3A:
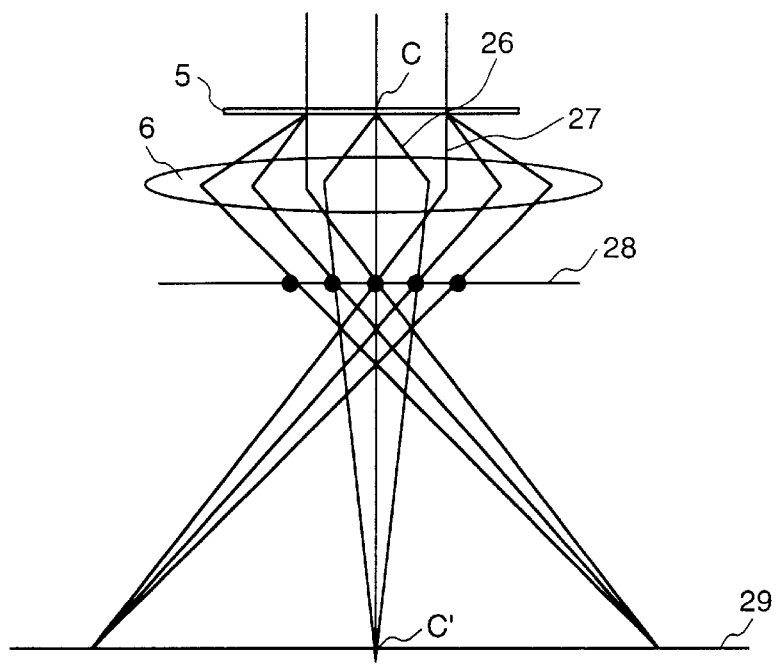
FIG. 3 is a diagram indicating the shift of the image due to inclined irradiation of the electron beam.
Figure 3B:
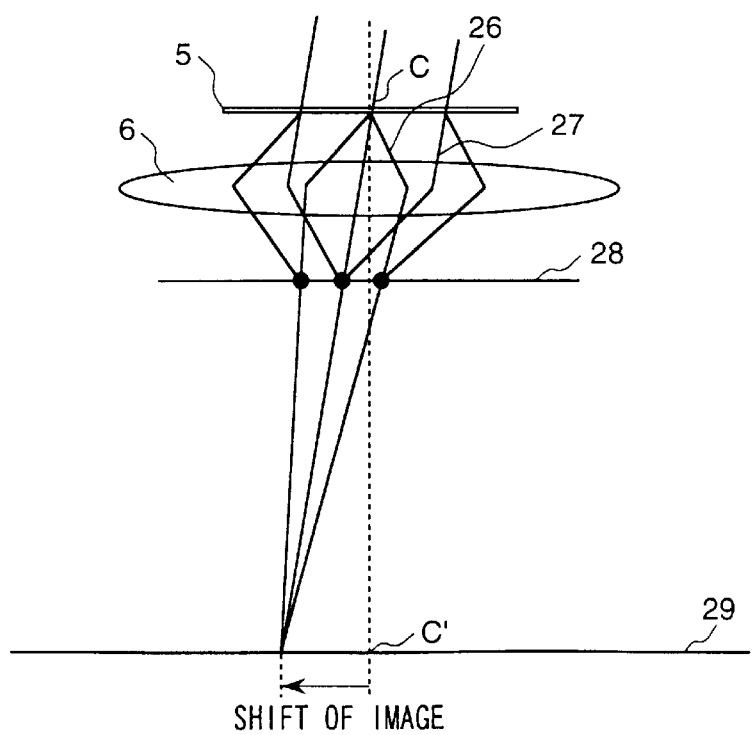

FIGS. 3A and 3B show the conditions of how the electron beam passing through the specimen 5 forms an image at the image plane 29 due to the post-field objective lens 6. As is shown in FIG. 3A, when the electron beam is impinged in a direction parallel to the optical axis, the directions of propagation of the transmitted electron beam 27 and the diffracted electron beam 26 that propagates in a different direction are changed by the post-field objective lens 6, and an electron beam diffraction image is formed at the back focal plane 28. The electron beams passing through the back focal plane 28 form an image plane 29 taking the specimen 5 as the physical plane and with a one-to-one correspondence between the image plane and the physical plane, and the center C of the specimen 5 which is the physical plane matches with the center C' of the object plane 29.

Figure 4:
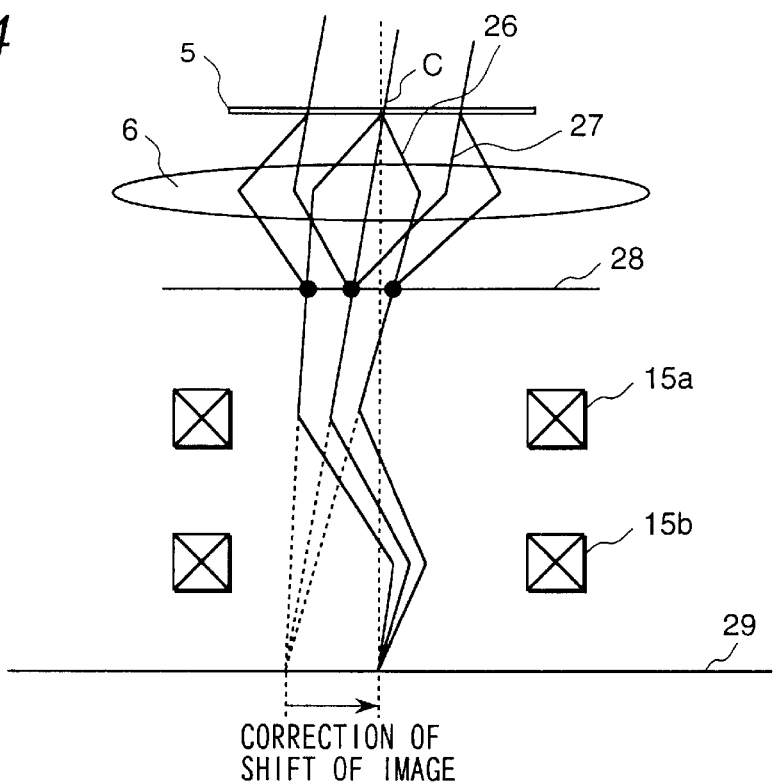
FIG. 4 is a diagram showing the first preferred embodiment of the present invention in which the shift of the image due to inclined irradiation of the electron beam is compensated by a deflection coil.

On the other hand, as is shown in FIG. 3B, when the electron beam is incident at an inclination to the optical axis, the electron beam passing through the back focal plane 28 takes the specimen 5 as the physical plane, and although it forms a one-to-one corresponding image plane 29, the center C' of the image plane will have shifted from the optical axis. If the image plane 29 is enlarged and the image is acquired by the image acquisition apparatus in this condition, an image that is shifted in position relative to parallel irradiation will be observed, and hence it will not be possible to observe the same location with a different direction of electron beam incidence. In order to solve this problem, as is shown in FIG. 4, it is sufficient to place a first stage image shift coil 15a and a second stage image shift coil 15b below the post-field objective lens 6 and to carry out compensation for the image shift. In the preferred embodiment of the image plane shift shown in FIG. 4, a method is used in which the deflection due to the first stage image shift coil 15a and the deflection due to the second stage image shift coil 15b are opposite in phase to each other and are made to move in parallel with a 1:1 ratio.

Figure 5:
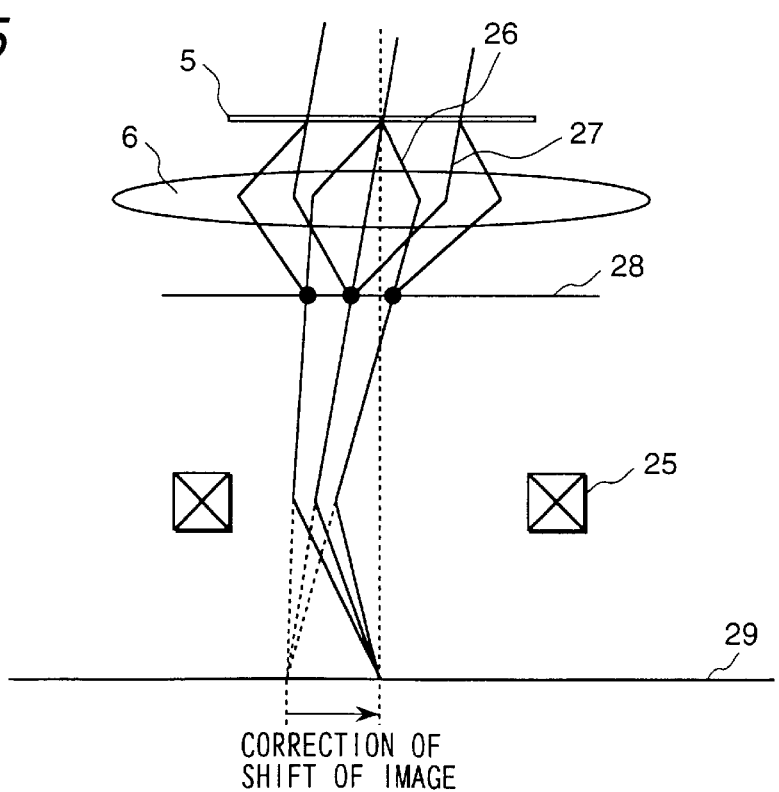
FIG. 5 is a diagram showing the second preferred embodiment of the present invention in which the shift of the image due to inclined irradiation of the electron beam is compensated by a deflection coil.

Further, in the preferred embodiment of the image plane shift shown in FIG. 5, a method is used in which the compensation is done by moving the image using the deflection due to the image shift coil 25. Also, as is evident from FIG. 3, since the angle of inclination of the electron beam with respect to the optical axis is equal to the angle subtended by the straight line connecting the center of the image plane and the center of the physical plane with the optical axis, if the focal length of the post-field objective lens 6 is kept fixed, it is possible to calculate the amount of image shift geometrically.

In this manner, since the amount of compensation for the image plane shift is determined uniquely for changes in the direction of electron beam incidence, it is possible to correct always the image shift due to changes in the direction of electron beam incidence by linking the current excitation conditions of the deflection coils and the image shift coil for changing the electron beam incidence direction using a computer program, etc.

Figure 19:
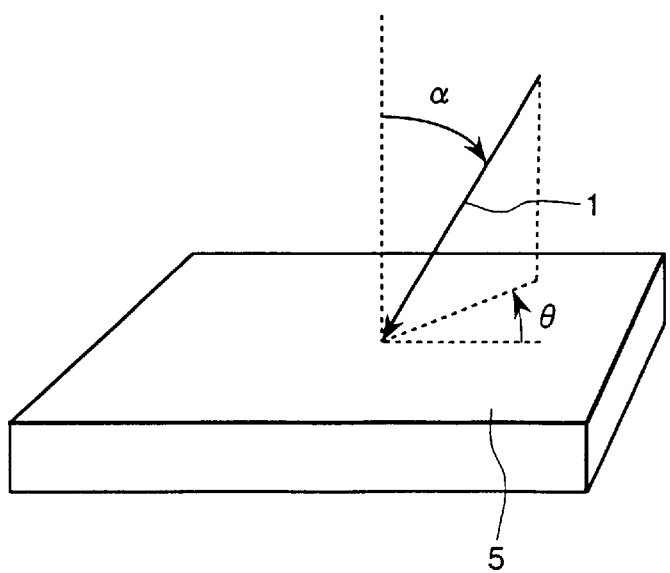
FIG. 19 is a diagram explaining the electron beam impinged on the specimen in the present invention.

The above change in the direction of electron beam incidence, as is shown in FIG. 19, is a combination of the angle of incidence α of the electron beam 1 and each orientation angle θ at a specific orientation angle θ of the two-dimensional plane of the specimen 5, and it is possible to detect crystal defects at a high speed and at a 100% probability by automatically compensating for the image plane shift caused by changes in the direction of incidence of the electron beam 1 at the corresponding angle of incidence α and orientation angle θ using an image shift coil and by acquiring the image at a high speed using an image acquisition apparatus.

Next, the method of carrying out the linking between the deflection coil and the image shift coil using the hardware of the apparatus is described below. The method of linking the above deflection coil and image shift coil consists of calculating using a computer program the ratio between the respective deflection amounts, and carrying out compensation for the image shift. On the other hand, there is also a method of realizing this linking without using a computer program.

Figure 6:
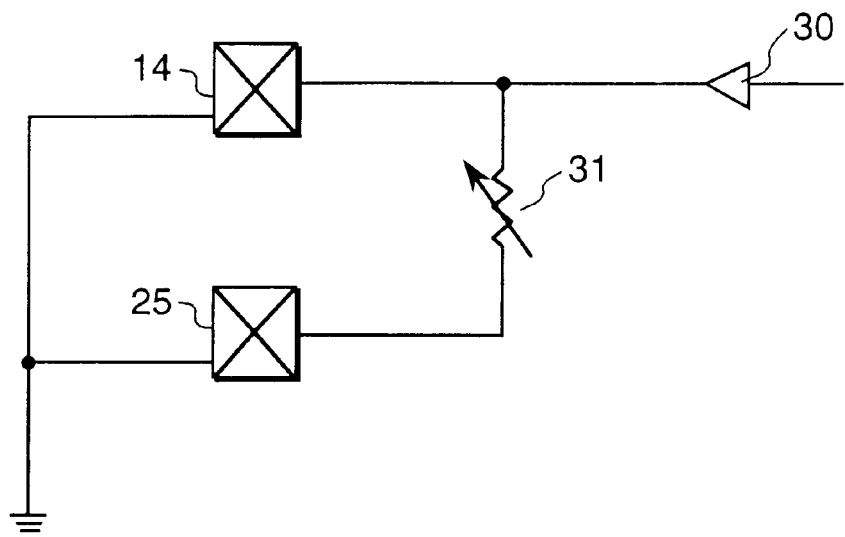
FIG. 6 is a diagram showing the first preferred embodiment of the method of controlling the deflection coil and the image shift coil.

FIG. 6 shows a method of realizing this linking by parallel connection between the deflection coil 14 and the image shift coil 25. The current from the amplifier 30 is divided between the deflection coil 14 and the image shift coil 25. A variable resistor 31 is connected in series with the image shift coil, and by varying the resistance value, it is possible to change the deflection ratio between the deflection coil 14 and the image shift coil 25, and to adjust so that the amount of image shift due to the deflection coil 14 is always matched by the image shift coil 25.

Figure 7:
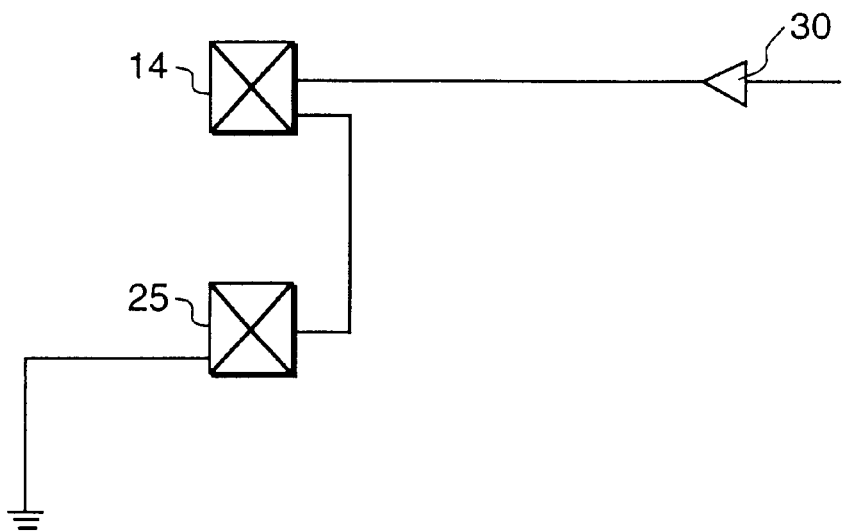
FIG. 7 is a diagram showing the second preferred embodiment of the method of controlling the deflection coil and the image shift coil.

FIG. 7 shows a method of realizing this linking by series connection between the deflection coil 14 and the image shift coil 25. In this case, since the current flows through both the deflection coil 14 and the image shift coil 25, the compensation is being made by making the image shift due to the deflection coil 14 being matched and canceled out by the image shift coil at all times by adjusting the deflection ratio between the two coils by varying the number of turns of either the deflection coil 14 or the image shift coil 25.

Next, the method of acquiring at a high speed the transmission electron microscope image while changing the direction of electron beam incidence is described below.

In order to detect the crystal defects present in the specimen at a probability of 100% as described above, it is necessary to observe the same location with multiple different incidence directions of the electron beam. In order to realize this at a high speed, it is necessary to first acquire the transmission electron microscope images at a high speed at a specific direction of electron beam incidence, and then subsequently to acquire at a high speed the transmission electron microscope images at a different direction of electron beam incidence.

Figure 8:
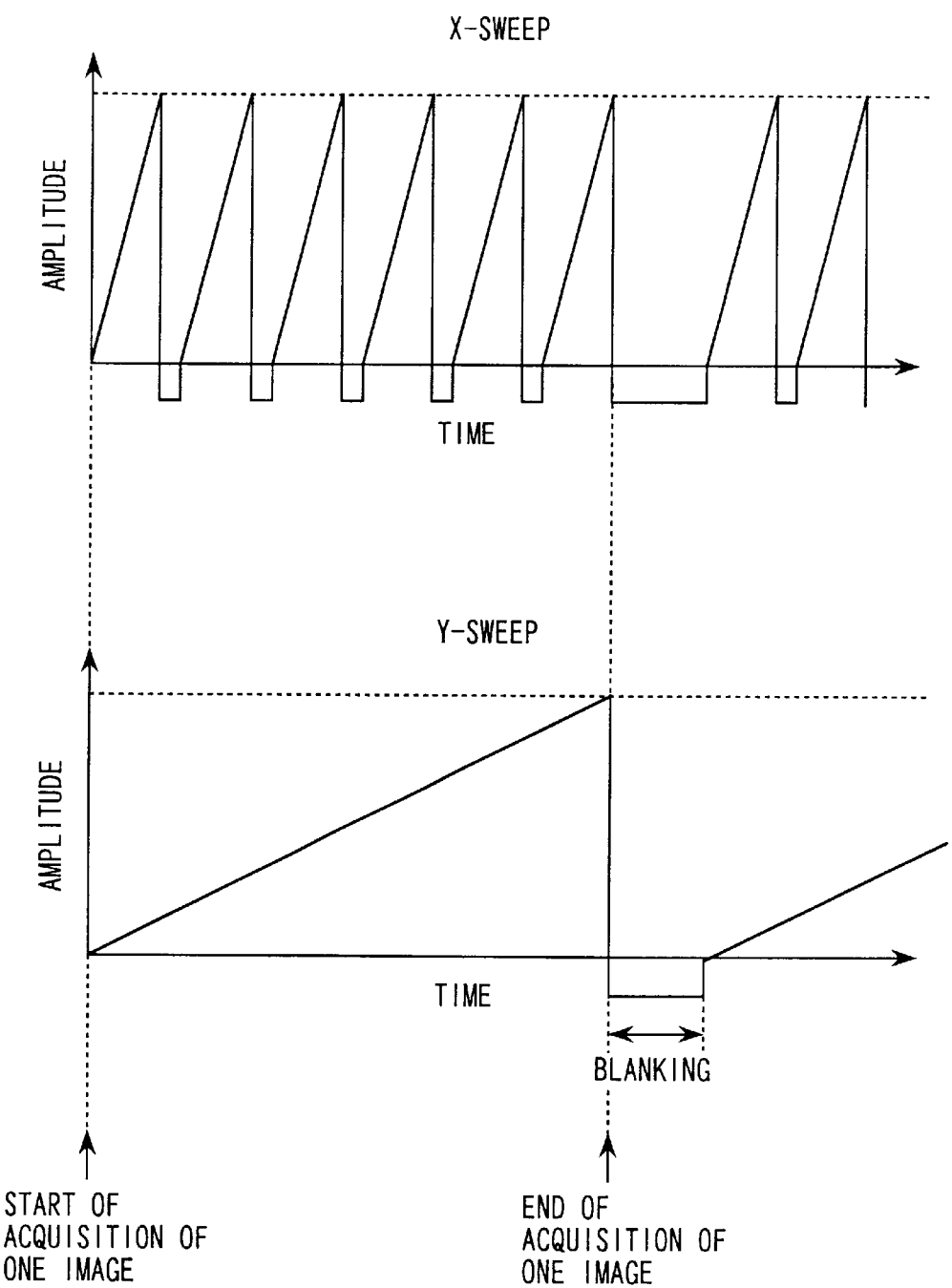
FIG. 8 is a diagram showing the methods of X and Y deflection and blanking during image acquisition by the image acquisition apparatus.

FIG. 8 shows the idealized X and Y sweep waveforms when acquiring images in the case when the image acquisition apparatus acquires one screen of data in about 30 ms. The time taken for acquiring one screen is up to the point when the Y sweep reaches the specified amplitude, and it is not possible to change the electron beam incidence conditions during this period. However, there is a blanking period before starting the acquisition of the next screen during which time no image is acquired, and hence there is a blank interval of about 1 ms. Since it is possible to change the conditions of electron beam deflection within a time interval of several microseconds, it is possible to set the electron beam deflection conditions during this blanking period. In this manner, if the direction of incidence of the electron beam is changed during this blanking period from the end of acquisition of one screen to the beginning of acquisition of the next screen, the time required for inspecting one screen is determined only by the number of images to be acquired from the same location, and hence the inspection time can be shortened.

Further, it is possible to shorten the inspection time if defect judgment and stage movement are carried out during the blanking period.

Next, the placement of various detector devices used in detailed analysis of defects or abnormalities after inspecting for crystal defects, foreign matter, or pattern shape abnormalities is described below.

Figure 9:
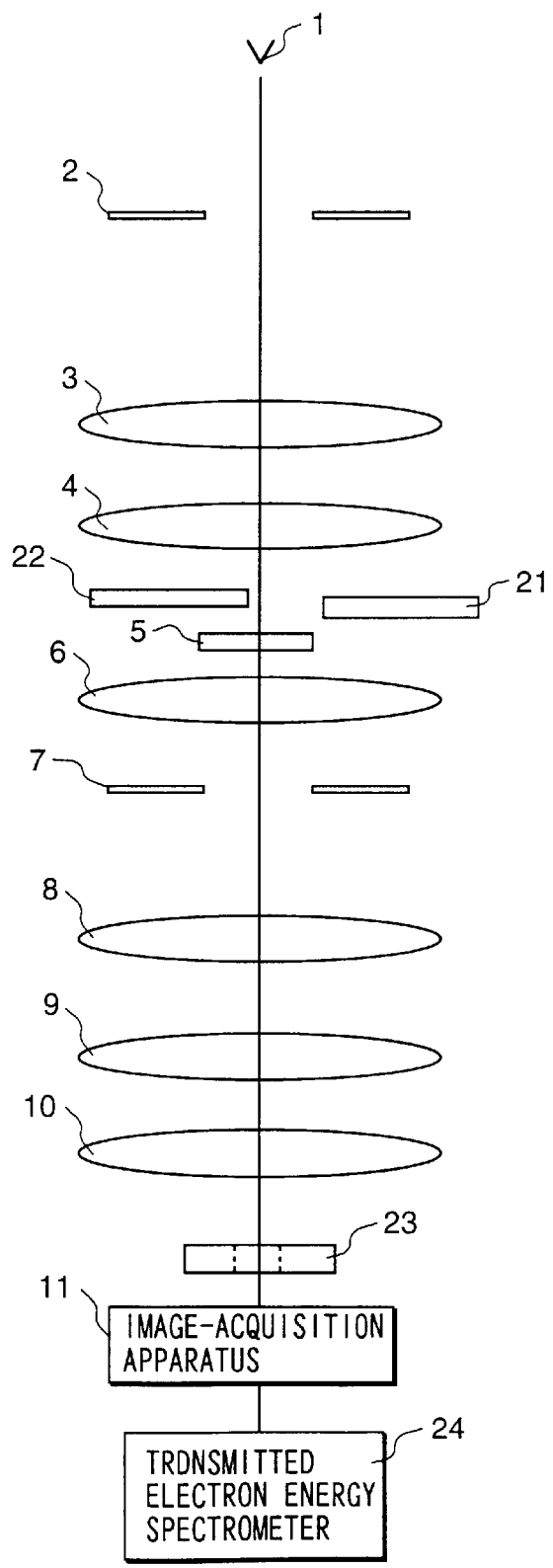
FIG. 9 is a diagram showing the placement of various detector devices used in detailed analysis.

FIG. 9 shows the placement of different detector devices in the main unit of the microscope. The X-ray spectrometer apparatus 21 is placed in the neighborhood of the specimen 5 and carries out spectrometry of characteristic X-rays excited at the specimen 5 by the electron beam. Normally, point, line, and area analyses are carried out using a probe formed by focusing the electron beam to a few nanometers in combination with the control of electron beam irradiation area and position using a scanning coil placed above the objective lens. The secondary electron detector 22 serves the purpose of detecting the secondary electrons generated from the surface of the specimen in synchronization with the deflection of the electron beam by said scanning coil, and thus observing the surface shape of the specimen. The transmitted electron detector 23 detects as intensity a part of the electron beam diffracted by the specimen, and its detection method is similar to that of the above secondary electron detector, and serves the purpose of observing the structure of the specimen 5 by detecting the intensity of the transmitted electron beam in synchronization with the deflection of the electron beam by said scanning coil. The transmitted electron beam energy spectrometer 24 carries out spectrometry of the energy of the electron beam that has passed through the specimen 5, and serves the purpose of determining the type of constituent elements in the specimen by the amount of energy loss that was suffered by the electron beam in the specimen.

Next, the flowchart is described of automatically inspecting for the crystal defects, foreign matter, and shape abnormalities in the specimen, and of carrying out detailed analysis of specific defect locations using a transmission electron microscope apparatus.

Figure 10:
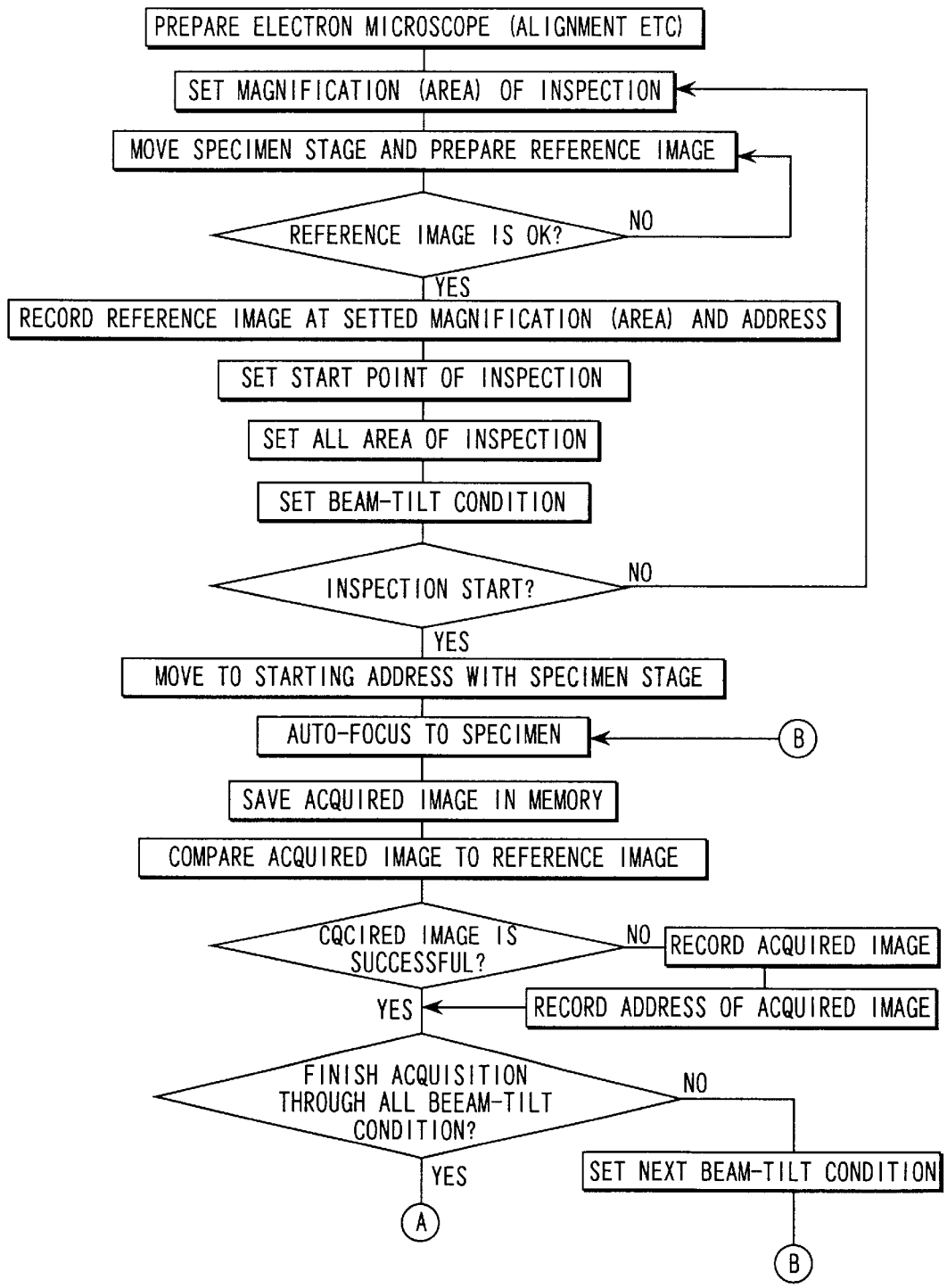
FIG. 10 is a flowchart showing the method of carrying out automatic inspection of defects, foreign matter, and shape abnormalities in the specimen using a transmission electron microscope apparatus.
Figure 11:
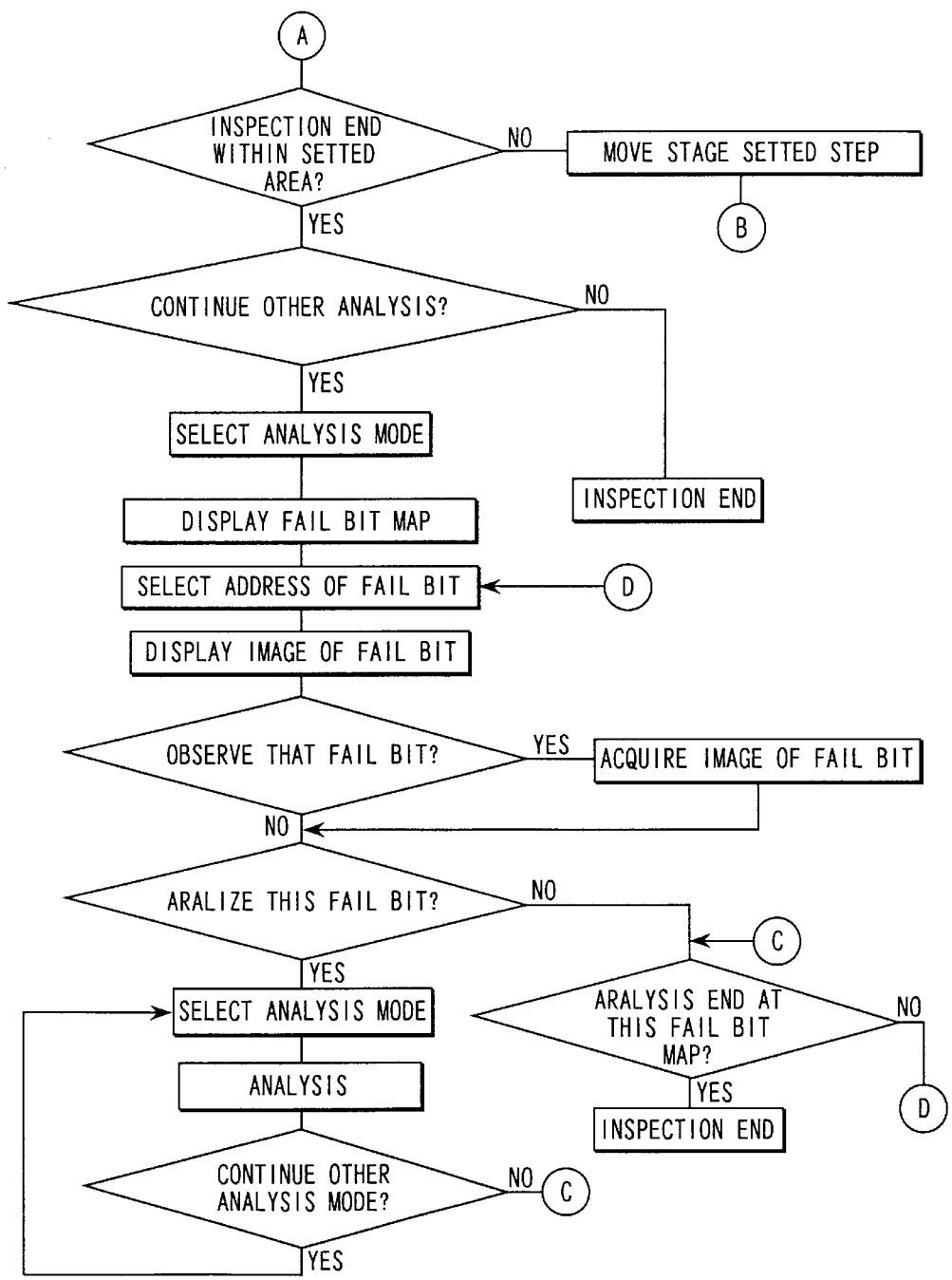
FIG. 11 is a flowchart showing the method of carrying out automatic inspection of defects, foreign matter, and shape abnormalities in the specimen using a transmission electron microscope apparatus.

FIGS. 10 and 11 are flowcharts indicating in detail the procedures of setting the inspection conditions, carrying out inspection and detailed analysis. The operator has to carry out preparation of the transmission electron microscope as preparations for the inspection. This includes installing the sample in the microscope, applying high voltage, determining the optical axis, etc. All these operations are made by giving instructions using interactive input and output from the control screen of the transmission electron microscope apparatus. When these preparatory operations are completed, the transmission electron microscope image appears on the control screen of the transmission electron microscope apparatus.

Figure 12:
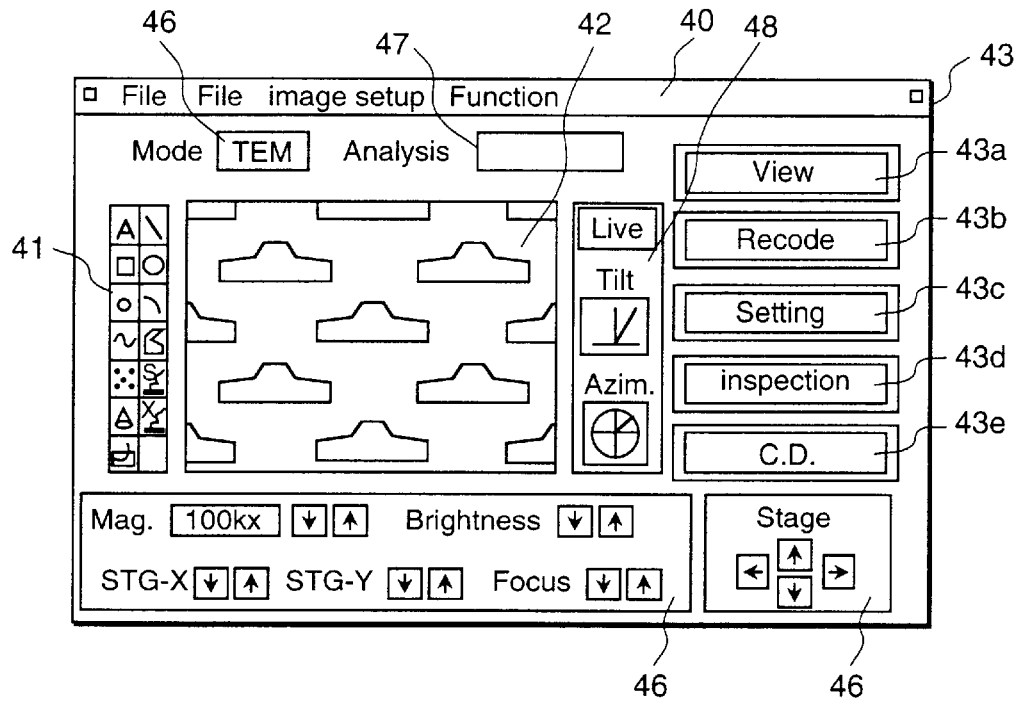
FIG. 12 is the input/output screen for displaying the control and inspection results of a transmission electron microscope apparatus.
Figure 13:
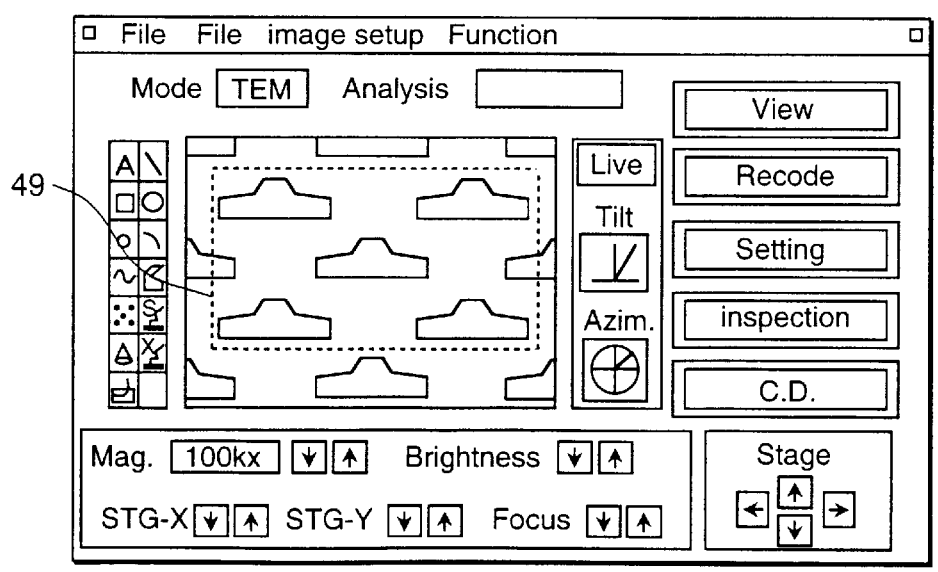
FIG. 13 is an example of a diagram showing the method of specifying the area of acquiring one image data during automatic inspection of defects, foreign matter, and shape abnormalities in the specimen.

FIG. 12 shows an example of the control screen of the transmission electron microscope apparatus. This is a control screen based on the graphical user interface, and it is possible to edit the conditions of equipment control and image using pull-down menus from the menu bar 40. In addition, the tool box 41 contains icon displays for specifying the inspection area or for selecting the analysis method, and these functions can be used by merely clicking the corresponding icons. The image display section 42 displays the image acquired by the image acquisition apparatus, and it is possible to select the type of image to be displayed using the pull-down menu from the observation mode selection box 46. The operating box 43 is provided to the right of the image display section 42. The functions that are used most frequently are displayed as large box switches from the first operating box 43a to the fifth operating box 43e, and the operator can customize the allocation of functions to these switches. The electron microscope controlling section 44 is one that permits the operator to carry out manually the basic operations of the transmission electron microscope. Similarly, the specimen stage controlling section 45 permits the operator to move the stage manually. The observation mode selecting box 46 indicates the currently selected mode. Although the analysis mode selecting box 47 has functions equivalent to the toolbox 41, this box permits selection of the analysis mode using a pull-down menu bar. The observation condition display section 48 displays the current observation conditions, and indicates whether the image being displayed in the image display section 42 is a live image or an image read out from a file, or can also indicate the direction of electron beam incidence. After a transmission electron microscope image is displayed in the control screen of the transmission electron microscope apparatus, the inspection magnification ratio or the inspection area has to be specified. In the case of magnification ratio specification, the size of the display screen itself becomes one screen of the inspection area. On the other hand, in the case of area specification, as is shown in FIG. 13, the operator can select the selected area 49 with any shape. Next, the operator searches for the reference image by manually moving the stage. This reference image is the basic image with which the part under inspection is compared during inspection, and the operator can select a specific part of the specimen under inspection. On the other hand, an image from the design drawings file can be read out and displayed in the image display section as an overlay image while varying the magnification ratio, and can be set as the reference image. Once the reference image is determined, it is recorded, and also a file containing the reference image address and observation conditions is recorded at the same time.

Figure 14:
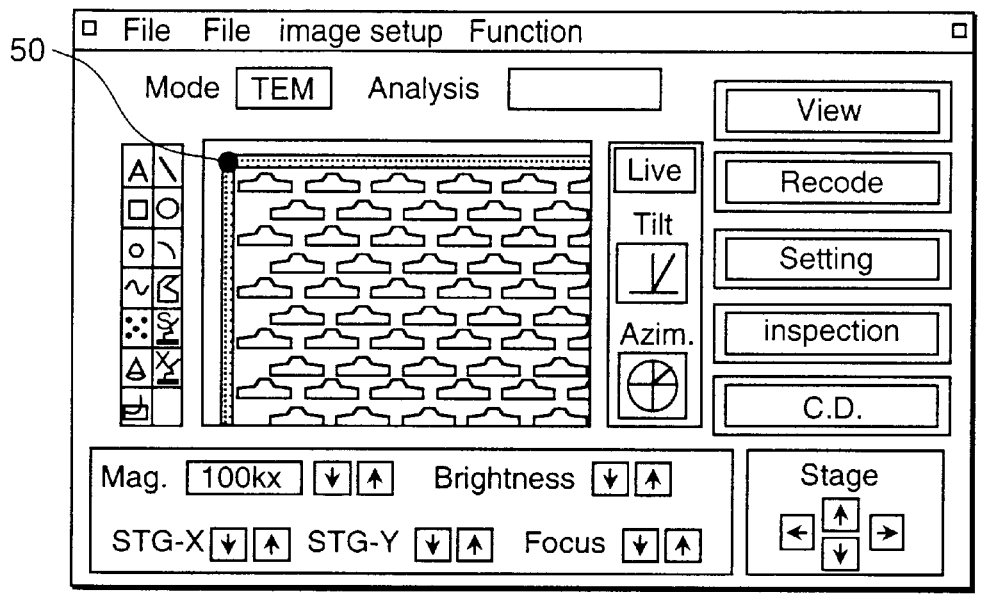
FIG. 14 is an example of a diagram showing the method of specifying the starting point of inspection during automatic inspection of defects, foreign matter, and shape abnormalities in the specimen.
Figure 15:
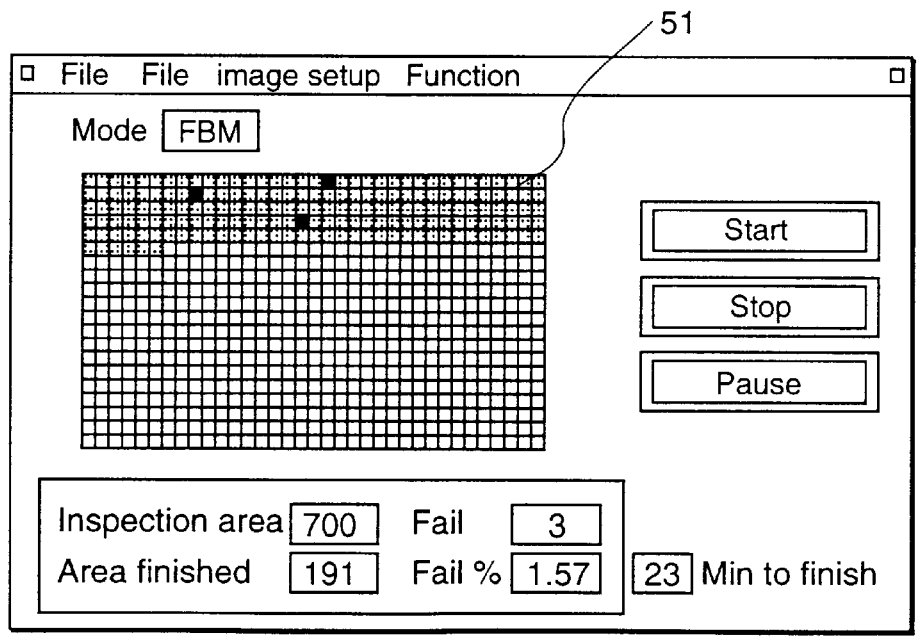
FIG. 15 is a diagram showing the screen displaying the fail bit map during automatic inspection of defects, foreign matter, and shape abnormalities in the specimen.

Next, the inspection starting point has to be specified. As is shown in FIG. 14, when the operator marks the inspection starting point 50 with the mouse in the image display section 42, that point becomes the starting point of inspection and its address will be recorded. Next, the entire inspection area has to be specified. When inspecting repeated patterns, it is necessary to enter in numerals the number of repetitions of the inspection area in the vertical direction and the number of repetitions of the inspection area in the horizontal direction. On the other hand, the stage is moved manually and the inspection end point is specified.

Next the beam tilting conditions are set. Here, the operator specifies the number of types of beam tilting conditions under which the observation is to be made in one inspection region. Although the probability of defect detection increases when there are more beam tilting conditions, the inspection time increases. On the other hand, although the probability of defect detection decreases when there are fewer beam tilting conditions, the inspection time decreases. The operator determines the number of beam tilting conditions considering these factors. The operations up to the above are those in which the operator carries out the setting manually, and the operations thereafter are those of automatic inspection. When the inspection start button is pressed, the stage is moved automatically to the inspection starting address and the inspection is started from that point. The routine of automatic measurement during inspection is as follows. Firstly, the focus is adjusted automatically to the area to be inspected and the image is stored in the memory. This image is compared with the reference image, and the next beam tilting condition is set if the image is judged to be normal, and if the image is judge to be abnormal, the image along with its address is stored in a recording medium such as a hard disk, etc., and then the next beam tilting condition is set. These operations of observation and judgment are repeated until the observation under all the beam tilting conditions are completed, and when the observation under all the beam tilting conditions are completed, the specimen stage is moved automatically to the next inspection area. The operations up to this point are the basic operations for one inspection area.

Next, the flowchart when carrying out detailed analysis is described below. To begin with, the inspection conditions should be selected. When automatic inspection is to be done under multiple inspection conditions, this step is used for selecting which of the conditions is to be used for carrying out detailed analysis. When the inspection condition is selected, the fail bit map is displayed on the display screen as the inspection result. The operator first selects from the fail bit map the defect point whose inspection status is to be known. The recorded image of the selected defect point is then displayed. Also, a dialog box appears asking the operator whether to observe that defect point immediately. If it is to be observed immediately, the stage is moved up to the defect point automatically, and the image of that point is acquired. The operator judges whether or not to carry out detailed analysis of the defect point, and selects either to continue observation or to carry out detailed analysis.

Figure 16:
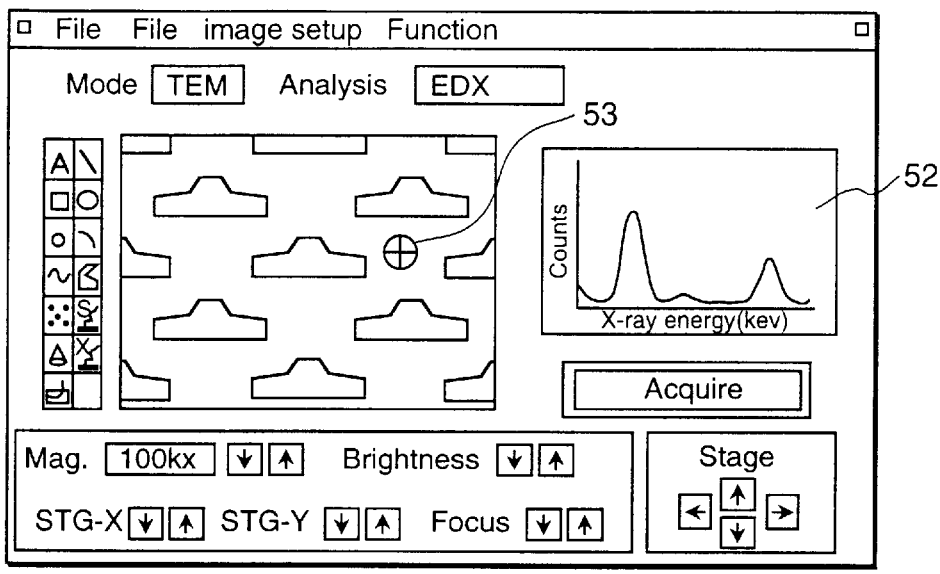
FIG. 16 is an example of the input/output screen when carrying out detailed analysis after automatic inspection of defects, foreign matter, and shape abnormalities in the specimen.

FIG. 16 is the display screen when X-ray analysis is selected as the analysis mode. The analysis point is specified using the pointing device 53 for specifying the analysis point, whereupon the progress of analysis and the result of analysis are displayed in the display section for result of analysis 52. After the analysis has been completed, the operator judges whether to carry out some other type of analysis for the same defect point. If the analysis is judged to have been completed, the operator judges to carry out detailed analysis of some other defect point in the same fail bit map, and if the analysis has to be continued, the operator returns to the screen of selecting the defect address, and repeats the above flow for detailed analysis. When all the analysis has been completed, the inspection is terminated.

Figure 17:
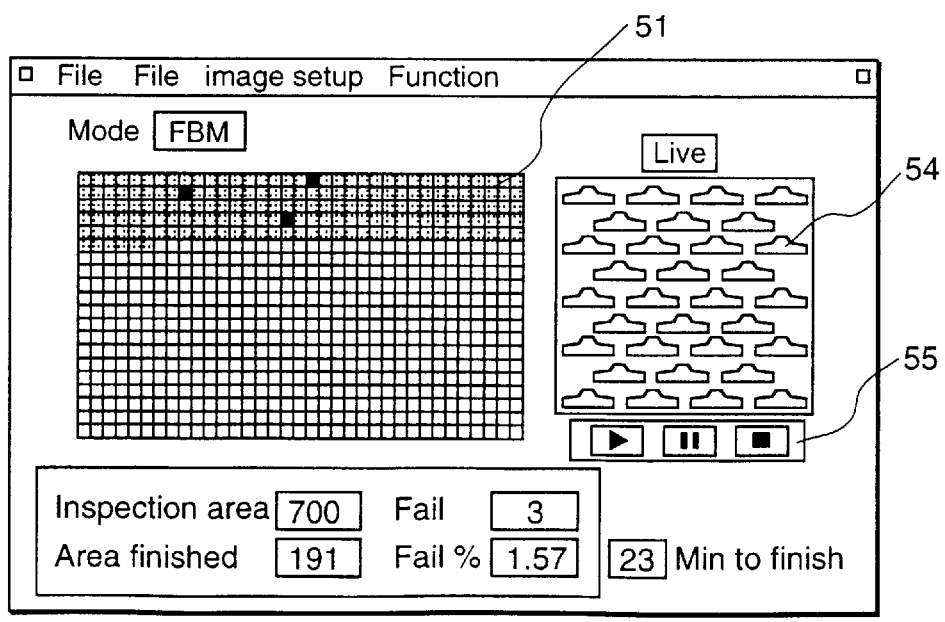
FIG. 17 is a diagram showing the screen for displaying both the fail bit map and the acquired image during automatic inspection of defects, foreign matter, and shape abnormalities in the specimen.

FIG. 17 is an example of the screen displaying both the fail bit map being inspected and the image that is currently being observed. When live image display is selected in the image setup menu, the live image 54 is displayed next to the fail bit map. If live image display is not selected, a toolbox for controlling the starting of inspection of the displayed part is displayed in the form of the icons 55 for starting, temporarily halting, and stopping the inspection.

Figure 18:
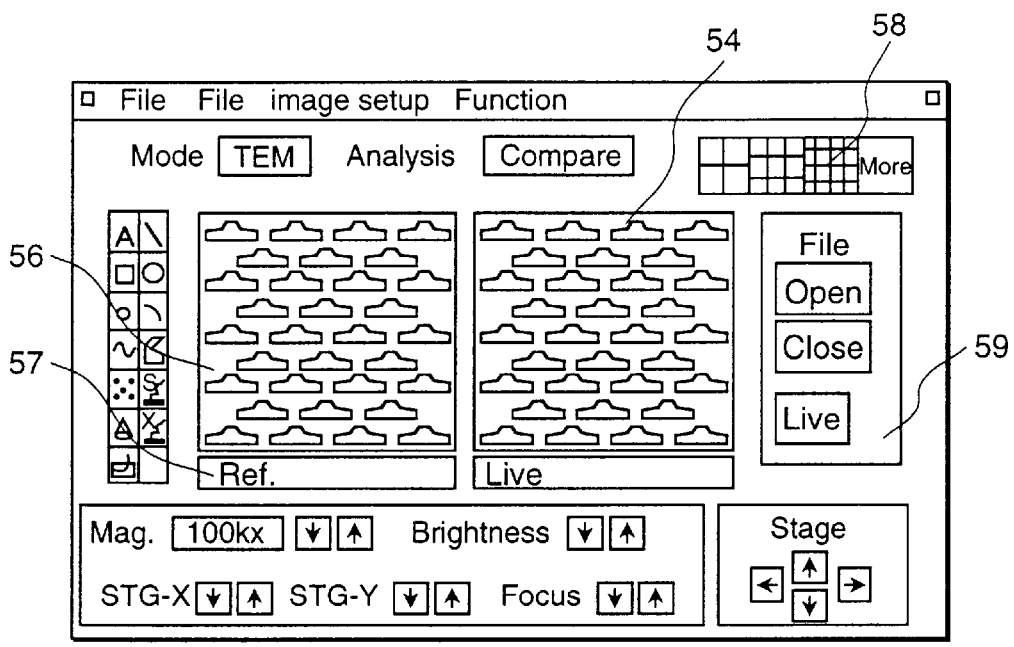
FIG. 18 is a diagram showing the screen for displaying both the fail bit map and the acquired image during automatic inspection of defects, foreign matter, and shape abnormalities in the specimen.

FIG. 18 is an example of the screen displaying the reference image and the recorded image or the live image simultaneously after the inspection has been completed. In this example, the screen is divided into two parts in which the reference image 56 and the live image 54 are being displayed. The status box 57 indicates what that image is, what are the electron beam irradiation conditions are, and the address. The setting of divided display of the image to be made in the screen is set by the screen display division selection box 58, and it is possible to select either two-division display or four-division display. The calling of the image has been set so that it can be made from the switch of the file control box 59.

The tilting conditions of the electron beam used during the inspection are determined by the type of crystal, size of the defect, number of defects, and the accuracy of inspection. When the crystal is silicon and an electron beam of 200 kV is being used, the reflection from <111> is 8 mrad, from <220> is 13 mrad, and from <400> is 18 mrad. The basic reflections of the lowest order are these three, and these three reflections can be observed when the electron beam inclination is a maximum of 18 mrad. In addition, the accuracy of inspection gets improved if the setting is made so that the higher order reflection is about two or three times, that is, a maximum of about 50 mrad.

The size of the defect that can be inspected is determined by the size of one pixel of the image acquisition apparatus and the observation magnification factor of the transmission electron microscope. If the size of one pixel of the image acquisition apparatus is 20 $\mu$m, a defect of 2 nm size exactly fits in one pixel at a transmission electron microscope magnification factor of 10,000, and one defect will be judge to be present. Because of this, several small defect will be present in one pixel and their number cannot be judged accurately, but it will be judged that only one defect is present. By specifying the defect size estimating conversely from this, it is possible to determine automatically the observation magnification factor of the transmission electron microscope, and hence, it is possible to inspect automatically defects of size smaller than the size specified as one of the inspection modes.

The number of types of electron beams that are to be tilted has a direct relationship with the accuracy of inspection. In the case of observation from only one direction, it is not possible to observe all the defects, as has been mentioned earlier, it is possible to simplify this if the crystal orientation is utilized. In other words, it is possible to carry out inspection by tilting the electron beam limiting to a specific reflection of the crystal orientation. In particular, when it is possible to expect beforehand that the defect is present in a specific crystal plane, for example, the <311> plane in the case of silicon, it is possible to shorten the inspection time by restricting the electron beam tilting conditions. In addition, in this case, it is possible to judge the presence or absence of defect by directly comparing two observation images in the same field of view with incidence in the <000> and <311> directions, and since no specific reference image is required, it is possible to shorten the time required for setting the reference image in the inspection preparation stage, and also, it is possible to prevent wrong judgment of defects caused by the minute difference in the shape between the reference image and the observed image, and hence this is a method that is effective for the inspection of the substrate itself that has no features in the basic shape.

According to the present invention, it is possible to detect at a high probability rate the crystal defects in the specimen by placing a deflection coil above the objective lens, and observing the image in the same field of view while varying the electron beam incidence direction using that deflection coil. It is possible to detect crystal defects at a high speed and a high probability rate by moving the deflection coil and the image shift coil in a linked manner thereby compensating for the image shift in the image acquisition apparatus. By automating the movement of the specimen stage and combining with the above defect detection method, it is possible to detect automatically the crystal defects and shape abnormalities, etc., over a wide area of the specimen and at a high speed. By recording the address of the detected crystal defect or shape abnormality section and reading it out after inspection, it is possible to automatically set the crystal defect or shape abnormality section at the analysis point at the time of detailed analysis after inspection.

What is claimed is:

1. A transmission electron microscope apparatus including an electrostatic lens that applies an accelerating voltage to an electron beam generated from an electron source, a specimen stage holding a specimen, a condenser lens and an objective lens provided so that said electron beam is focused on said specimen, a projection lens that enlarges the transmission image obtained by passing said electron beam through said specimen, an image acquisition apparatus that detects said enlarged transmission image, said transmission electron microscope apparatus comprising:

a setting device for setting a plurality of inclination conditions of said electron beam being irradiated on said specimen with different desired deflecting angles ($\alpha$, $\theta$) representing a combination of an angle of incidence $\alpha$ and an orientation angle $\theta$;

a deflection coil for sequentially deflecting said electron beam which is irradiated with said different desired deflecting angles ($\alpha$, $\theta$) according to said inclination conditions; and a shift coil for shifting said electron beam deflected by said deflection coil so as to automatically focus said electron beam on substantially a same position on said image acquisition apparatus;

wherein a good or no good condition of said specimen is inspected by comparing an output of said image acquisition apparatus with a reference image previously stored.

2. A transmission electron microscope apparatus according to claim 1, wherein said desired different deflecting angles ($\alpha$, $\theta$) is in a range of 8 to 50 mrad.

3. A transmission electron microscope apparatus according to claim 1, wherein a judgement of said good or no good condition of said specimen and deflecting by the electron beam according to said desired different deflecting angles ($\alpha$, $\theta$) are performed in a blanking time of a screen.

4. A transmission electron microscope apparatus including an electrostatic lens that applies an accelerating voltage to an electron beam generated from an electron source, a specimen stage holding the specimen, a condenser lens and an objective lens provided so that said electron beam is focused on said specimen, a projection lens that enlarges the transmission image obtained by passing said electron beam through said specimen, an image acquisition apparatus that detects said enlarged transmission image, said transmission electron microscope apparatus comprising:

a setting device for setting a plurality of inclination conditions of said electron beam being irradiated on said specimen with different desired deflecting angles ($\alpha$, $\theta$) representing a combination of an angle of incidence $\alpha$ and an orientation angle $\theta$;

a deflection coil for sequentially deflecting said electron beam which is irradiated with said different desired deflecting angles ($\alpha$, $\theta$) according to said inclination conditions, said deflection coil being provided between said specimen stage and said projection lens; and a shift coil for shifting said electron beam deflected by said deflection coil so as to automatically focus said electron beam on substantially a same position on said image acquisition apparatus;

wherein a good or no good condition of said specimen is inspected by comparing an output of said image acquisition apparatus with a reference image previously stored.

5. A transmission electron microscope apparatus according to claim 4, wherein said shift coil is composed of a first shift coil and a second shift coil.

6. A method of inspecting a semiconductor specimen using a transmission electron microscope apparatus, said method comprising the steps of:

setting a plurality of inclination conditions of an electron beam being irradiated on said specimen with different desired deflecting angles ($\alpha$, $\theta$) representing a combination of an angle of incidence $\alpha$ and an orientation angle $\theta$;

sequentially deflecting said electron beam which is irradiated with said different desired deflecting angles ($\alpha$, $\theta$) according to said inclination conditions; and shifting said electron beam deflected by said deflection coil so as to automatically focus said electron beam on substantially a same position on an image acquisition apparatus for detecting an image of said electron beam;

wherein a good or no good condition of said specimen is inspected by comparing an output of said image acquisition apparatus with a reference image previously stored.

7. A method of detecting defects in a specimen using a transmission electron microscope apparatus in which there is an electrostatic lens that applies an accelerating voltage to an electron beam generated from an electron source, a condenser lens and an objective lens provided so that said electron beam is focussed on said specimen, a projection lens that enlarges the transmission image obtained by passing said electron beam through said specimen, an image acquisition apparatus that detects said electron beam that has passed through said specimen, and a display apparatus that displays the image of said specimen based on the output from said image acquisition apparatus, said method comprising the steps of:

setting a plurality of inclination conditions of said electron beam being irradiated on said specimen with different desired deflecting angles ($\alpha$, $\theta$) representing a combination of an angle of incidence $\alpha$ and an orientation angle $\theta$;

sequentially deflecting said electron beam which is irradiated with different multiple deflection angles ($\alpha$, $\theta$) representing a combination of an angle of incidence $\alpha$ and an orientation angle $\theta$;

shifting back said electron beam with a shift coil according to said different multiple deflection angles ($\alpha$, $\theta$) so as to automatically focus said electron beam on substantially a same position on said image acquisition apparatus; and displaying on said display apparatus the image of said specimen based on the output of said image acquisition apparatus obtained by irradiating said specimen with said electron beam at said different multiple deflection angles ($\alpha$, $\theta$).

\* \* \* \* \*